United States Patent
Osako

(10) Patent No.: US 8,956,965 B2
(45) Date of Patent: Feb. 17, 2015

(54) DISPLAY PANEL MANUFACTURING METHOD, DISPLAY PANEL, AND DISPLAY APPARATUS

(71) Applicant: Panasonic Corporation, Osaka (JP)

(72) Inventor: Takashi Osako, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/733,958

(22) Filed: Jan. 4, 2013

(65) Prior Publication Data

US 2013/0130491 A1   May 23, 2013

Related U.S. Application Data

(63) Continuation of application No. PCT/JP2011/006491, filed on Nov. 22, 2011.

(51) Int. Cl.
| | | |
|---|---|---|
| *H01L 21/44* | (2006.01) | |
| *H01L 21/283* | (2006.01) | |
| *H01L 51/00* | (2006.01) | |
| *H01L 51/52* | (2006.01) | |
| *H01L 27/32* | (2006.01) | |
| *H01L 27/12* | (2006.01) | |

(52) U.S. Cl.
CPC .......... *H01L 21/283* (2013.01); *H01L 51/0021* (2013.01); *H01L 51/5253* (2013.01); *H01L 27/3276* (2013.01); *H01L 27/124* (2013.01)
USPC ............... 438/608; 438/22; 438/29; 438/458; 257/E33.061; 257/E51.019

(58) Field of Classification Search
USPC ......... 438/22, 458, 608; 257/57–79, E21.415
See application file for complete search history.

(56) References Cited

U.S. PATENT DOCUMENTS

| | | | |
|---|---|---|---|
| 5,443,922 A | | 8/1995 | Nishizaki et al. |
| 2002/0056837 A1* | | 5/2002 | Yamanaka et al. ............... 257/57 |
| 2004/0259326 A1* | | 12/2004 | Hideo ............................ 438/458 |
| 2005/0069641 A1* | | 3/2005 | Matsuda et al. ............... 427/226 |
| 2007/0054430 A1 | | 3/2007 | Nishigaki |
| 2009/0021154 A1* | | 1/2009 | Aota .............................. 313/504 |
| 2012/0107996 A1* | | 5/2012 | Sheng et al. ..................... 438/71 |
| 2012/0119235 A1 | | 5/2012 | Nishiyama et al. |
| 2012/0156436 A1* | | 6/2012 | Kim et al. ...................... 428/172 |
| 2012/0268002 A1 | | 10/2012 | Osako et al. |

FOREIGN PATENT DOCUMENTS

| | | |
|---|---|---|
| JP | 05-163488 | 6/1993 |
| JP | 2002-151254 | 5/2002 |
| JP | 2003-208975 | 7/2003 |
| JP | 2007-059229 | 3/2007 |
| JP | 2007-073355 | 3/2007 |
| JP | 2007-080569 | 3/2007 |
| JP | 2009-049001 | 3/2009 |

OTHER PUBLICATIONS

ISR (ISA/210) of PCT/JP2011/006491 (PCT-1549), Feb. 28, 2012.

* cited by examiner

*Primary Examiner* — Charles Garber
*Assistant Examiner* — Abdulfattah Mustapha
(74) *Attorney, Agent, or Firm* — Greenblum & Bernstein, P.L.C.

(57) ABSTRACT

A method of manufacturing a display panel having a display part and a terminal part each formed on a different area on a TFT substrate, comprising: a step of forming the display part on the TFT substrate; a step of forming a conductive layer of a conductive metal oxide or a metal on an area where the terminal part is to be formed; a step of forming a chemical vapor deposition layer of an inorganic compound by a chemical vapor deposition method so that the chemical vapor deposition layer covers the display part and comes into contact at least with an upper surface of the conductive layer and so that the upper surface of the conductive layer alters; and a step of removing a portion of the chemical vapor deposition layer on the conductive layer.

9 Claims, 12 Drawing Sheets

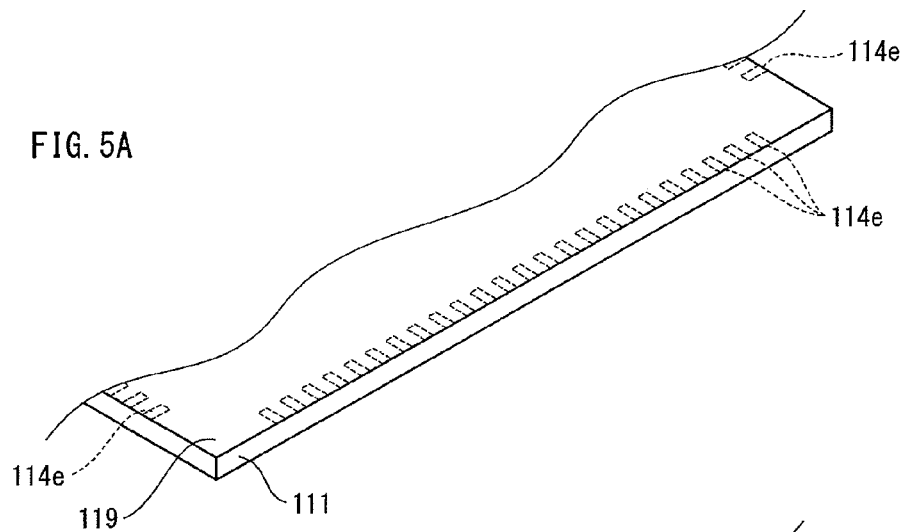
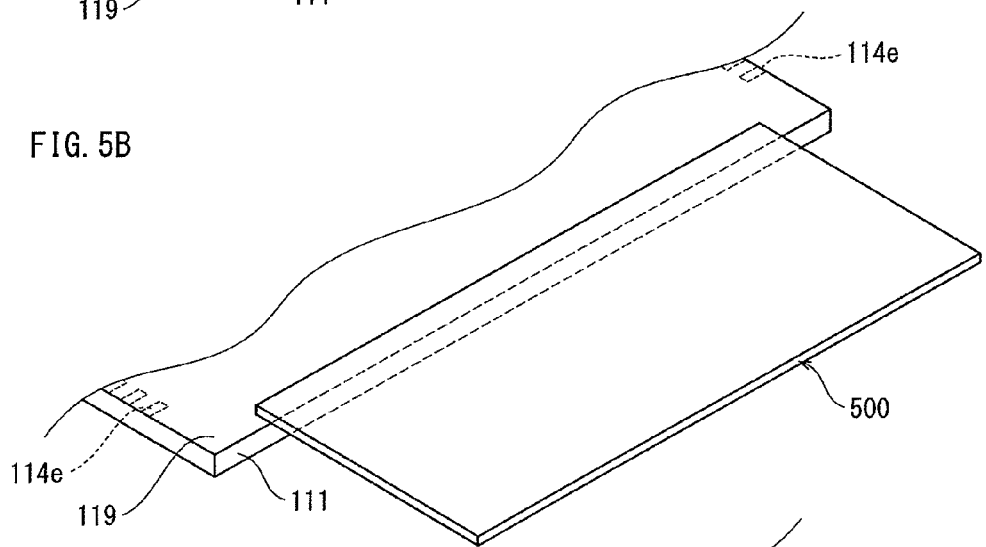
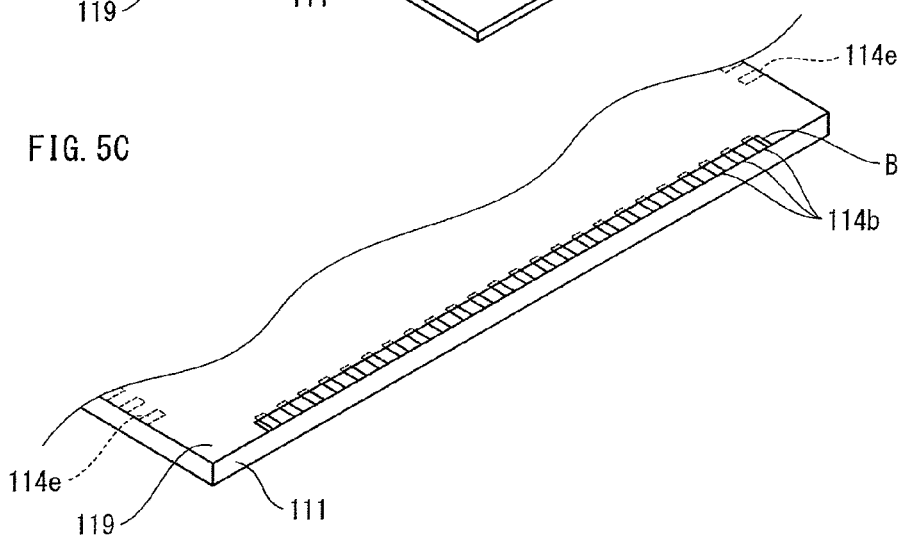

D — Cross section line

FIG. 9

| | Specifications | Resistance | Note |
|---|---|---|---|
| Test 1 | glass/ITO | 97Ω | Without sealing layer |
| Test 2 | glass/ITO/Al$_2$O$_3$2nm | 150Ω | 1.5 times the resistance in Test 1 |
| Test 3 | glass/ITO/Al$_2$O$_3$5nm | 196Ω | 2 times the resistance in Test 1 |
| Test 4 | glass/ITO/Al$_2$O$_3$8nm | — | Not conductive |
| Test 5 | glass/ITO/Al$_2$O$_3$10nm | — | Not conductive |
| Test 6 | glass/ITO/Al$_2$O$_3$20nm | — | Not conductive |
| Test 7 | glass/ITO/SiN620nm/Al$_2$O$_3$20nm (SiN and Al$_2$O$_3$ will be removed) | 84Ω | Same as in Test 1 (Not conductive when SiN and Al$_2$O$_3$ are not removed) |

FIG. 10

| | Specifications | Conditions | | | Results | |
|---|---|---|---|---|---|---|
| | | Temperature (°C) | Pressure (Mpa) | Duration (sec) | State of conductivity/ removability | Note |
| Test 8 (Basic conditions) | glass/ITO/SiN620nm/Al₂O₃20nm | 250 | 0.12 | 15 | OK | |
| Test 9 (for thermal hardening) | | 300 | 0.12 | 15 | OK | Tape is hard to remove |
| Test 10 (for pressure hardening) | | 250 | 0.20 | 15 | OK | No effect of pressure |
| Test 11 (for pressure hardening) | | 250 | 0.05 | 15 | OK | No effect of pressure |
| Test 12 (without particles) | | 250 | 0.12 | 15 | OK | No effect of particles |

US 8,956,965 B2

DISPLAY PANEL MANUFACTURING METHOD, DISPLAY PANEL, AND DISPLAY APPARATUS

CROSS REFERENCE TO RELATED APPLICATION

This is a continuation application of PCT Application No. PCT/JP2011/006491 filed Nov. 22, 2011, designating the United States of America, the disclosure of which, including the specification, drawings and claims, is incorporated herein by reference in its entirety.

TECHNICAL FIELD

The present disclosure relates to a method of manufacturing a display panel, a display panel, and a display apparatus.

BACKGROUND ART

In manufacturing a display panel having a display part formed on the middle area of the substrate and a terminal part formed on the peripheral area of the substrate, there is a conventional approach to prevent the alteration of the display part due to moisture, gas, or the like by forming a passivation layer of SiN (silicon nitride) so as to cover the display part by using a chemical vapor deposition (CVD) method. According to this approach, the passivation layer needs to cover the entire display part. However, if the terminal part is also covered with the passivation layer, the passivation layer causes low conductivity between the terminal part and the wiring terminals connected to the terminal part. In view of this problem, the passivation layer is formed by selective film formation using a mask, in order to prevent the passivation film from covering the terminal part.

In this regard, it is not easy to form the passivation layer exactly on a desired area by a CVD method. In order to completely cover the display part while not covering the terminal part, it is necessary to provide a wide gap between the display part formation area where the display part is to be formed and the terminal part formation area where the terminal part is to be formed so that the periphery of the passivation layer does not overlap the terminal part. However, such a wide gap is not preferable because it increases the size of the display panel.

According to a manufacturing method disclosed in Patent Literature 1, the passivation film is formed by the following steps: first, as shown in FIG. 13A, a display part 905 composed of a bottom electrode 902, an organic light-emitting layer 903 and a top electrode 904 is formed on a substrate 901, while an adhesive anisotropic conductive film (ACF) 907 with a protective laminate 906 is attached to the area on the bottom electrode 902 where the terminal part is to be formed; next, as shown in FIG. 13B, an SiN layer 908 is formed to cover the display part 905 and the ACF 907; and finally, as shown in FIG. 13C, the formation of the passivation layer 909 is completed by removing the portion of the SiN layer 908 on the protective laminate 906 by peeling off the protective laminate 906. With this method, the ACF 907 will not be covered with the passivation layer 909, and hence the conductivity between the ACF 907 and the wiring terminals will not be degraded.

CITATION LIST

Patent Literature

[Patent Literature 1] Japanese Patent Application Publication No. 2003-208975

SUMMARY

However, according to the manufacturing method disclosed in Patent Literature 1, it is necessary to attach the ACF 907 before forming the SiN layer 908. Therefore, after sequentially forming the bottom electrode 902, the organic light-emitting layer 903 and the top electrode 904, it is necessary to suspend the lamination process to take out the substrate 901 from a chamber and to attach the ACF 907 to the substrate 901. The substrate 901 is then put back into the chamber to resume the lamination process, and, finally, the SiN layer 908 is formed. In this way, the lamination process will be complicated. In addition, since the substrate 901 needs to be taken into and out of the chamber, there is a risk of foreign objects such as dust attaching to the substrate 901. Therefore, with this manufacturing method, it is necessary to take a measure to reduce the risk. Therefore, with this method, it is impossible to manufacture display panels efficiently.

Considering the above problems, one non-limiting and exemplary embodiment provides a display panel manufacturing method and a display apparatus manufacturing method that can be applied for accurately and efficiently forming a passivation layer on a desired area.

In one general aspect, the techniques disclosed here feature a method of manufacturing a display panel having a display part and a terminal part each formed on a different area on a substrate, comprising: a display part formation step of forming the display part on the substrate; a conductive layer formation step of forming a conductive layer of a conductive metal oxide or a metal on an area on the substrate where the terminal part is to be formed; a chemical vapor deposition layer formation step of forming a chemical vapor deposition layer of an inorganic compound by a chemical vapor deposition method so that the chemical vapor deposition layer covers the display part and comes into contact at least with an upper surface of the conductive layer and so that the upper surface of the conductive layer alters; and a removal step of removing a portion of the chemical vapor deposition layer by peeling the portion off, the portion being located on the conductive layer.

Note that the term "remove" in the present disclosure means removal by physical means, and does not include removal by chemical means. In addition, grinding or the like is not considered as a physical means. One example of the removal in the present disclosure is physically removing the portion while keeping the portion in a layer-like or film-like shape.

The method includes: a conductive layer formation step of forming a conductive layer of a conductive metal oxide or a metal on an area on the substrate where the terminal part is to be formed; a chemical vapor deposition layer formation step of forming a chemical vapor deposition layer of an inorganic compound by a chemical vapor deposition method so that the chemical vapor deposition layer covers the display part and comes into contact at least with an upper surface of the conductive layer and so that the upper surface of the conductive layer alters; and a removal step of removing a portion of the chemical vapor deposition layer by peeling the portion off, the portion being located on the conductive layer. Therefore, a sealing layer as the residue of the chemical vapor deposition layer after the removal step can be formed exactly on the desired area. In addition, since it is unnecessary to attach the ACF in the middle of the process for forming the display part, the sealing layer can be effectively formed.

These general and specific aspects may be implemented using a device.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF DRAWINGS

FIGS. 5A through 5C are an illustration of a method of manufacturing the display panel.

FIG. 9 shows the results of tests about the influence of a chemical vapor deposition layer and an atomic layer deposition film on the conductivity.

FIG. 10 shows the results of tests about the influence of the state of adhesive tape on the removability.

DETAILED DESCRIPTION

Figure 1:
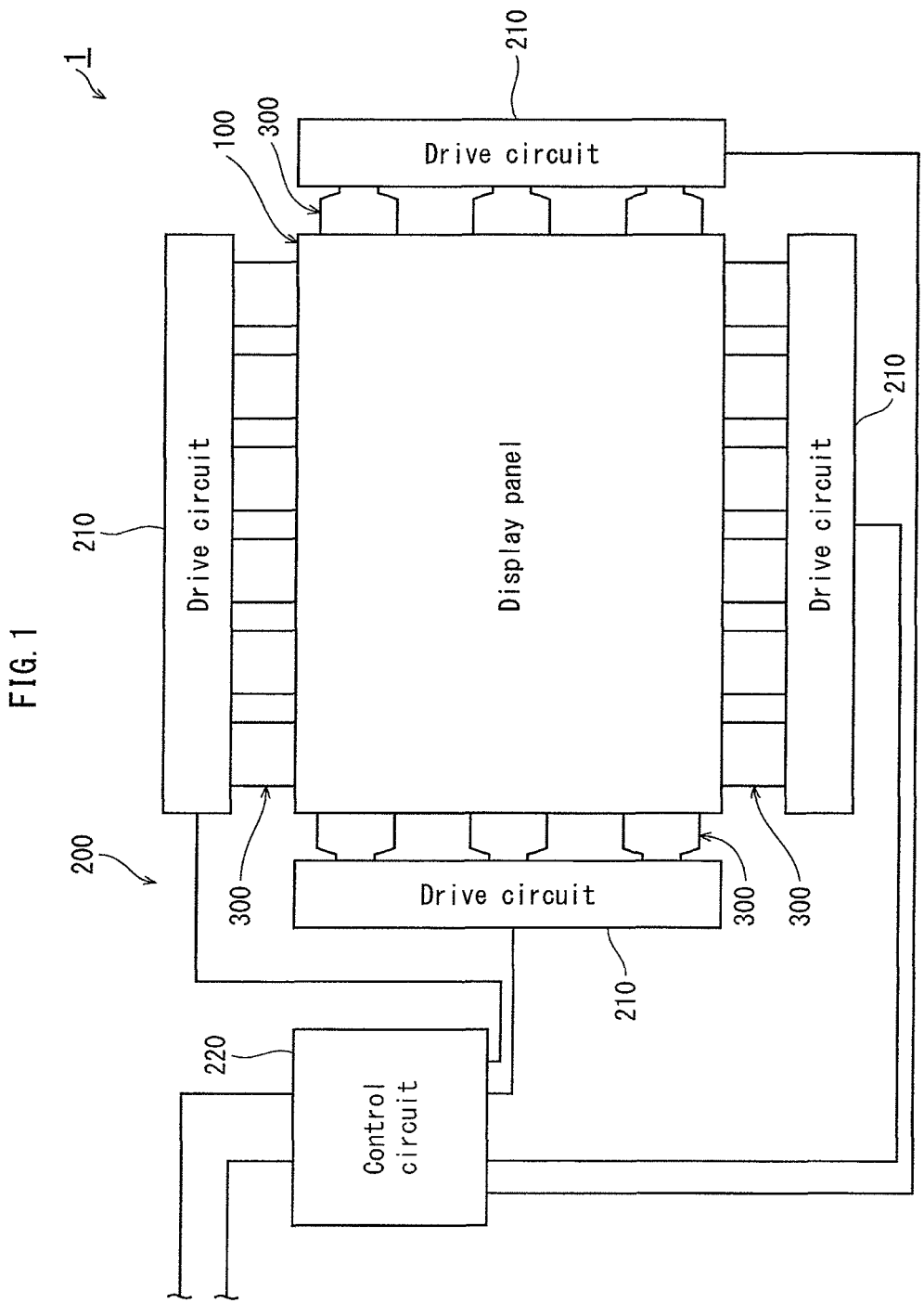
FIG. 1 shows an overall structure of a display apparatus according to one aspect of the present invention.

The following describes a display panel manufacturing method, a display apparatus manufacturing method, a display pane, and a display apparatus each pertaining to an aspect of the present invention, with reference to the drawings. Note that in the drawings the components may be not drawn to scale.

[Overview of Aspects of the Present Invention]

In one general aspect, the techniques disclosed here feature a method of manufacturing a display panel having a display part and a terminal part each formed on a different area on a substrate, comprising: a display part formation step of forming the display part on the substrate; a conductive layer formation step of forming a conductive layer of a conductive metal oxide or a metal on an area on the substrate where the terminal part is to be formed; a chemical vapor deposition layer formation step of forming a chemical vapor deposition layer of an inorganic compound by a chemical vapor deposition method so that the chemical vapor deposition layer covers the display part and comes into contact at least with an upper surface of the conductive layer and so that the upper surface of the conductive layer alters; and a removal step of removing a portion of the chemical vapor deposition layer by peeling the portion off, the portion being located on the conductive layer.

The conductive layer may be made of a conductive metal oxide, and the chemical vapor deposition layer formation step may include a sub-step of causing alteration of the conductive metal oxide contained in the upper surface of the conductive layer by reduction thereof using a reducing gas.

The method may further comprise: an adhesive tape attaching step of attaching adhesive tape onto the portion of the chemical vapor deposition layer after performing the chemical vapor deposition layer formation step and before performing the removal step, wherein in the removal step, the portion of the chemical vapor deposition layer may be peeled off by pulling the adhesive tape off.

The method may further comprise an atomic layer deposition film formation step of forming an atomic layer deposition film on the chemical vapor deposition layer by an atomic layer deposition method after performing the chemical vapor deposition layer formation step and before performing the removal step.

The method may further comprise an adhesive tape attaching step of attaching adhesive tape onto a portion of the atomic layer deposition film after performing the atomic layer deposition film formation step and before performing the removal step, the portion being located above the conductive layer, wherein in the removal step, the portion of the chemical vapor deposition layer and the portion of the atomic layer deposition film may be peeled off by pulling the adhesive tape off.

The conductive metal oxide may be ITO or IZO.

The reducing gas may be SiN or $SiH_4$.

The techniques disclosed here also feature a display panel having a display part and a terminal part each formed on a different area on a substrate, wherein the display part is covered with a passivation layer of an inorganic compound formed by a chemical vapor deposition method, the terminal part is made of a conductive metal oxide or a metal and is not covered with the passivation layer, and at least part of the upper surface of the terminal part is altered by the vapor deposition method.

The techniques disclosed here also feature a display apparatus having the display panel.

[Display Apparatus]

FIG. 1 shows an overall structure of a display apparatus according to one aspect of the present invention. As shown in FIG. 1, a display apparatus 1 pertaining to one aspect of the present invention includes a display panel 100, a drive control unit 200, and a wiring board 300. The display panel 100 is, for example, an organic EL panel utilizing electroluminescence effects. The drive control unit 200 includes four drive circuits 210 and a control circuit 220. The wiring board 300 is, for example, a flexible wiring board, on which an IC as the drive circuit 210 is mounted.

Figure 2:
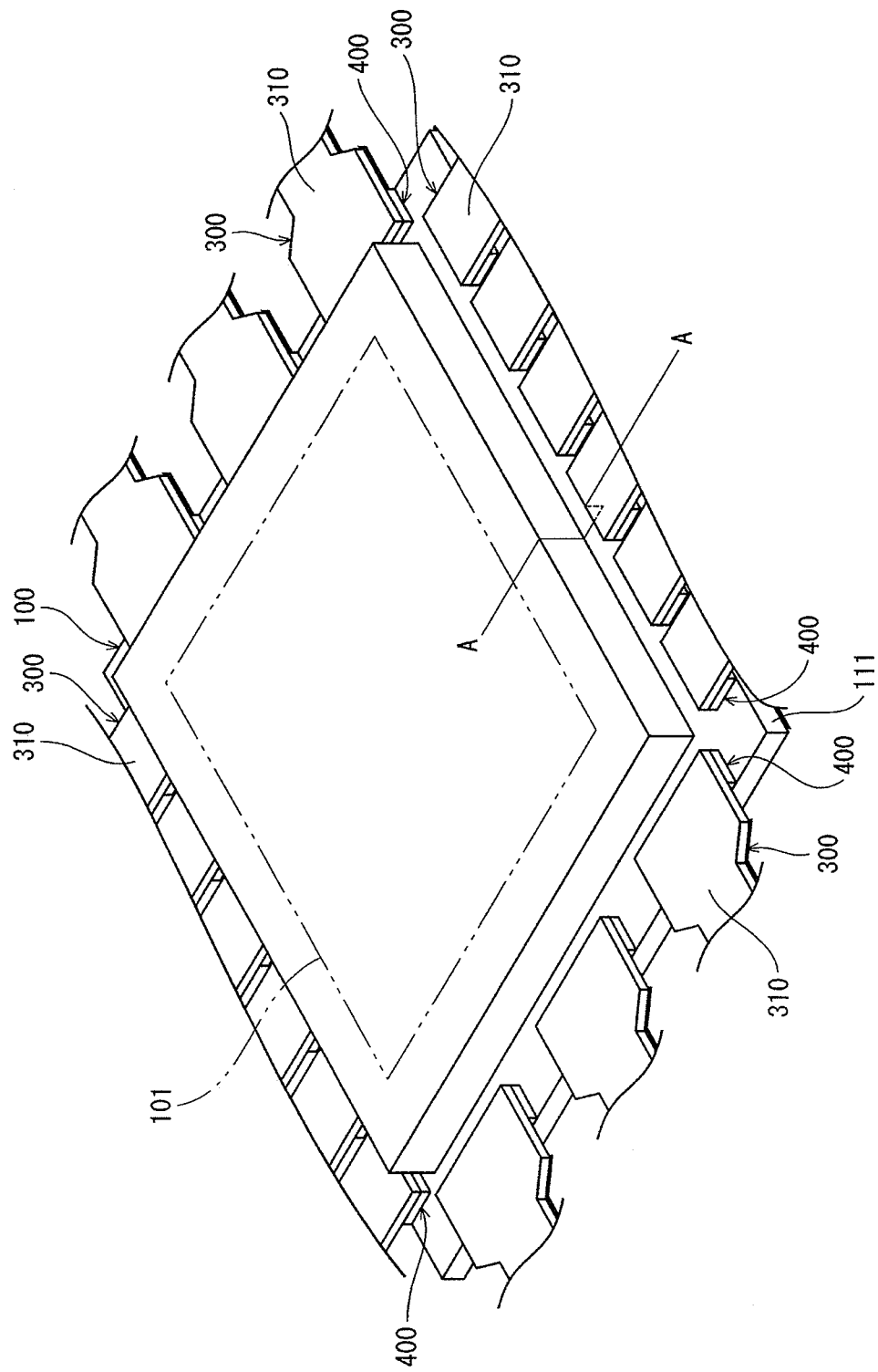
FIG. 2 is a perspective view showing connections between a display panel and a wiring board.

FIG. 2 is a perspective view showing connections between the display panel 100 and the wiring board 300. As shown in FIG. 2, a display part 101 is formed on the middle of the display panel 100 (i.e. the area surrounded by a two-dot chain line in FIG. 2), and a terminal part 114 including a plurality of terminals (see FIGS. 3 and 5A through 5C) is formed on the peripheral area surrounding the middle area, along all the four sides of the display panel 100.

The wiring board 300 is, for example, made by forming a conductive pattern (omitted from the drawing) of copper or the like on a base film 310 made of polyimide. In each connector of the wiring board 300, a wiring terminal 320 (see FIG. 3) is formed on the bottom surface (i.e. the main surface)

of the base film 310 facing the display panel 100 (i.e. facing a TFT substrate 111). The wiring terminals 320 respectively correspond in position to the terminals in the terminal part 114, and are electrically connected to the conductive pattern.

The wiring terminals 320 formed on the connectors of the wiring board 300 are adhered to the peripheral area of the TFT substrate 111 via an adhesive anisotropic conductive film (ACF) 400 along all the four sides of the display panel 100. The ACF 400 electrically connects the terminals in the terminal part 114 of the display panel 100 with their corresponding wiring terminals 320 of the wiring board 300.

Note that the terminal part 114 is not necessarily formed along all the four sides of the display panel 100. The terminal part 114 may be formed along only one side, two sides, or three sides of the display panel 100. The drive circuit 210 and the wiring board 300 only need to adhere to the area where the terminal part 114 is formed.

[Display Panel]

Figure 3:
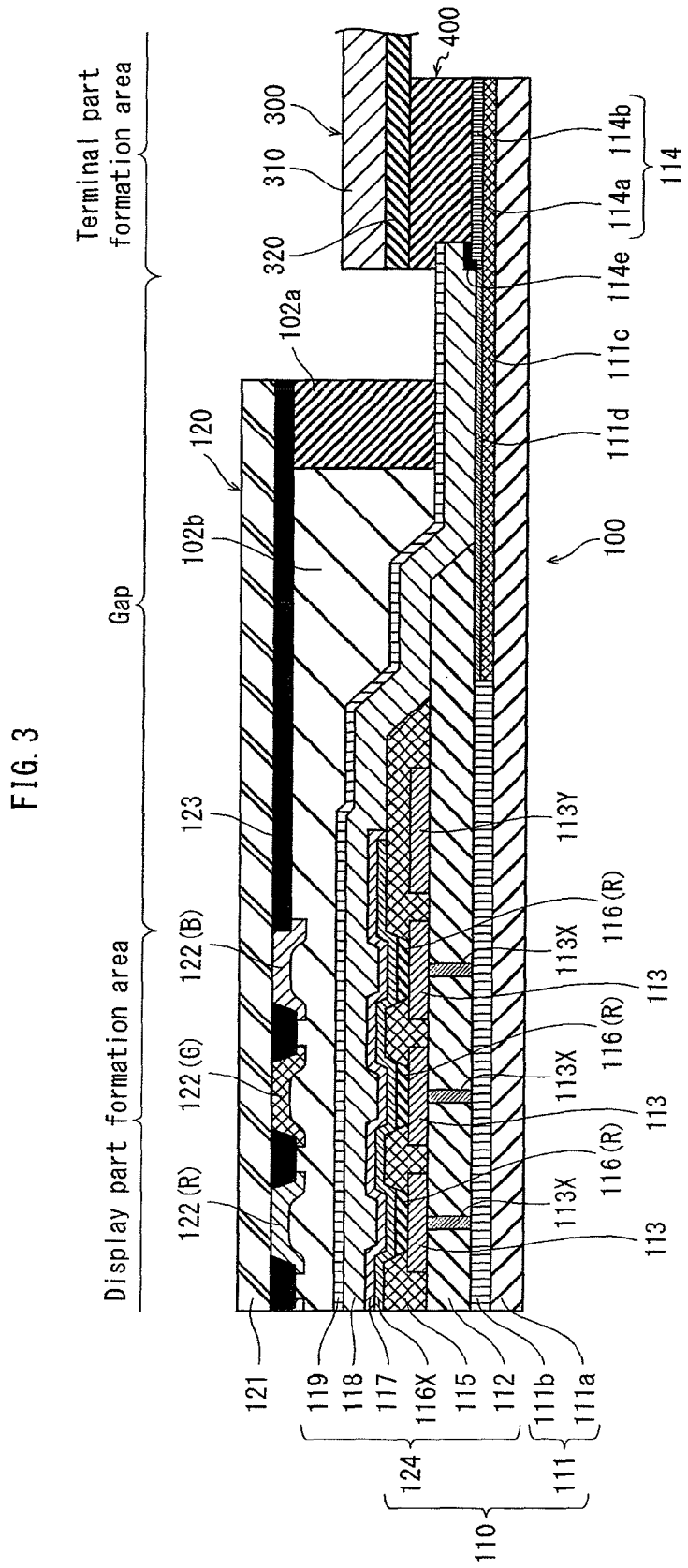
FIG. 3 shows a cross-section along the A-A line shown in FIG. 2.

FIG. 3 shows a cross-section along the A-A line shown in FIG. 2. As shown in FIG. 3, the display panel 100 includes, for example, a device substrate 110 and a color filter (CF) substrate 120. The device substrate 110 and the CF substrate 120 are arranged face to face.

A sealer 102a is interposed between the device substrate 110 and the CF substrate 120, and the gap between the device substrate 110 and the CF substrate 120 is filled with a resin layer 102b. The sealer 102a and the resin layer 102b are made of dense resin material (such as silicone resin or acrylic resin), and seal the display part 101 of the device substrate 110 so as to prevent organic light-emitting layers 116 from coming into contact with moisture or gas.

The display part 101 is formed on the upper surface of the TFT substrate 111 (i.e. the main surface that is closer to the CF substrate 120 than the other surface is. In the following description, in regards to each of the layers constituting the device substrate 110, the surface closer to the CF substrate 120 is referred to as "the upper surface"). The display part 101 includes a plurality of pixels arranged in a matrix. R (red), G (green) or B (blue) light emitted from each pixel passes through the CF substrate 120, and thus a color image is displayed on the front side of the display panel 100. The part terminal 114 is formed on the peripheral area surrounding the display part 101 formed on the upper surface of the TFT substrate 111. Although the above example is provided with the CF substrate 120, the CF substrate is not essential.

<Device Substrate>

The device substrate 110 includes a TFT substrate 111 and an electro luminescence (EL) substrate 124. The EL substrate 124 is a laminate formed on the upper surface of the TFT substrate 111, and includes a planarizing film 112, bottom electrodes 113, contact holes 113X, an anode ring 113Y, banks 115, organic light-emitting layers 116, an electron transport layer 116X, a top electrode 117, a passivation layer 118, a protective film 119, and so on. Each of the pixels constituting the display part 101 on the device substrate 110 is a top-emission organic EL element composed of the bottom electrode 113, the organic light-emitting layer 116, the electron transport layer 116X and the top electrode 117.

The TFT substrate 111 is formed by, for example, laminating a TFT layer 111b on the upper surface of a substrate 111a. The TFT layer 111b includes, for example, SD wiring 111c and a passivation film 111d. The substrate 111a includes a base substrate made of insulative material, and a plurality of TFTs and their extraction electrodes are formed on the upper surface of the base substrate in a predetermined pattern. Examples of the insulative material are alkali-free glass, soda glass, nonfluorescent glass, phosphate glass, borate glass, quartz, acrylic resin, styrenic resin, polycarbonate resin, epoxy resin, polyethylene, polyester, silicone resin, and alumina. The passivation film 111d is a thin film made of SiO (silicon oxide) or SiN (silicon nitride), and protects the SD wiring 111c by covering it.

The planarizing film 112 is made of insulating material such as polyimide or acrylic resin, and planarizes the uneven upper surface of the passivation film 111d. Note that the planarizing film 112 is not essential.

The bottom electrodes 113 are electrically connected to the TFT layer 111b via the contact holes 113X. Note that each bottom electrode 113 may have a double-layer structure including a metal layer and a metal oxide layer, for example. The metal layer is made of light-reflective conductive material and formed in a matrix so as to correspond in position to the pixels. Examples of the light-reflective conductive material are Ag (silver), APC (alloy of silver, palladium, and copper), ARA (alloy of silver, rubidium, and gold), MoCr (alloy of molybdenum and chromium), NiCr (alloy of nickel and chromium). The metal oxide layer is made of conductive material such as ITO (indium tin oxide) or IZO (indium zinc oxide), and is formed on the metal layer so as to cover the metal layer.

Each terminal 114 has a double-layer structure including a metal layer 114a and a metal oxide layer 114b, for example. Each metal layer 114a is composed of a portion of the SD wiring 111c, and is made of high-conductive material with low electric resistance and high process stability. Examples of the high-conductive material include metals such as Cr, Mo, Al, Ti and Cu, and alloys containing such metals (e.g. MoW, MoCr, NiCr). The metal layers 114a are formed on the peripheral area on the TFT substrate 111 along all the four sides. Here, every two or more of the metal layers 114a constitute a group, and the groups are arranged with intervals. The metal oxide layers 114b are made of light transmissive material such as ITO or IZO, and are formed on the metal layers 114a so as to cover them. Note that a substance resulting from alteration of metal oxide (i.e. a residue of a damaged layer 114e, which will be described later) remains on the surface of each metal oxide layer 114b.

The banks 115 are made, for example, of insulative organic material (e.g. acrylic resin, polyimide resin, novolac-type phenolic resin), and are formed on the middle area on the TFT substrate 111 without covering the areas where the bottom electrodes 113 are formed. Although the banks 115 of the present embedment are pixel banks having a lattice structure, they may be line banks having a stripe structure.

The organic light-emitting layers 116 are formed on the areas that are defined by the banks 115 and correspond one-to-one to the pixels. When the display panel 100 is driven, each organic light-emitting layer 116 emits light of R, G or B due to re-combination of holes and electrons. The organic light-emitting layers 116 are made of organic material. Examples of the organic material include a fluorescent material such as an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

The electron transport layer 116X is made, for example, of barium, phthalocyanine, lithium fluoride, or a combination thereof, and has the function of transporting electrons injected through the top electrode 117 to the organic light-emitting layers 116.

The top electrode 117 is a transparent electrode that is made, for example, of a light-transmissive material such as ITO or IZO. The top electrode 117 is formed all over the display part 101 so as to cover the upper surfaces of the banks 115 and the organic light-emitting layers 116.

The sealing layer 118 is, for example, a layer covering the display part 101 so as to seal the display part 101 and prevent the organic light-emitting layers 116 from coming into contact with moisture or gas. The sealing layer 118 is made, for example, of a light-transmissive material such as SiN, SiO, SiON (silicon oxynitride), SiC (silicon carbide), SiOC (silicon oxide containing carbon), and is formed on the top electrode 117.

The protective film 119 is a layer covering the display part 101 so as to seal the display part 101 and prevent the organic light-emitting layers 116 from coming into contact with moisture or gas. The protective film 119 is made, for example, of a light-transmissive material such as $Al_2O_3$ (aluminum oxide) or MN (aluminum nitride), and is formed on the sealing layer 118. Since the protective film 119 is additionally formed on the sealing layer 118, even when there are sealing deficiencies called pin holes in the sealing layer 118, moisture or gas is prevented from entering into the sealing layer 118 through the pin holes.

In the above-described laminate structure of the EL substrate 124, other one or more layers such as a hole transport layer and a hole injection layer may be additionally formed between the bottom electrodes 113 and the organic light-emitting layers 116. Furthermore, other one or more layers such as an electron transport layer and an electron injection layer may be additionally formed between the organic light-emitting layers 116 and the top electrode 117.

<CF Substrate>

The CF substrate 120 includes: a glass substrate 121; R, G and B color filters 122 formed on the bottom surface (i.e. the main surface closer to the device substrate 110) of the glass substrate 121; and a black matrix layer 123.

The color filters 122 are light-transmissive layers made of a known resin material or the like, and each transmits visible light with a wavelength corresponding to R, G or B. The color filters 122 are formed in the areas corresponding one-to-one to the pixels.

The black matrix layer 123 is a black resin layer formed for the purpose of preventing external light from entering inside the panel, preventing the internal components from being seen through the CF substrate 120, reducing the reflection of external light and improving the contrast of the 120 display panel 100, for example. The black matrix layer 123 is made, for example, of an ultraviolet curable resin material containing black pigments that are highly light-absorbable and highly light-protective.

[Method of Manufacturing Display Panel and Display Apparatus]

The following describes a display panel manufacturing method pertaining to one aspect of the present invention. FIGS. 4 and 5 are an illustration of a method of manufacturing a display panel pertaining to one aspect of the present invention.

Figure 4A:
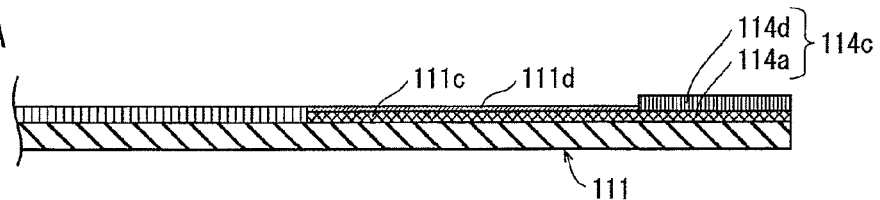
FIGS. 4A through 4G are an illustration of a method of manufacturing the display panel.

First, as shown in FIG. 4A, a laminate 114c composed of the metal layer 114a and the conductive layer 114d is formed on the area on the TFT substrate 111 where the terminal 114 is to be formed (hereinafter referred to as "terminal preparation area"). The laminate 114c will be the terminal 114. More specifically, the terminal preparation area is removed from the passivation film 111d on the TFT substrate 111 so that the metal layer 114a, which is a portion of the SD wiring 111c, is exposed. Then, the conductive layer 114d made of a conductive metal oxide is formed on the exposed portion of metal layer 114a by plasma deposition or sputtering.

Figure 4B:
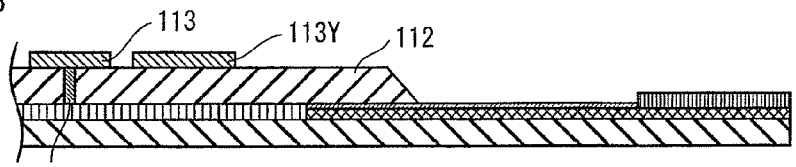

Next, as shown in FIG. 4B, the planarizing film 112 (having a thickness of 4 μm, for example) is formed by, for example, spin-coating a resin and patterning the resin by photoresist/photo etching. Furthermore, the contact holes 113X, the bottom electrodes 113, and the anode ring 113Y are formed.

The bottom electrodes 113 are formed by the following steps, for example: first, a metal thin film is formed by vacuum vapor deposition or sputtering, and then a metal layer is formed by patterning the metal thin film by photoresist/photo etching; next, a conductive metal oxide thin film is formed by plasma deposition or sputtering, and then a metal oxide layer is formed by patterning the metal oxide thin film by photoresist/photo etching.

Figure 4C:
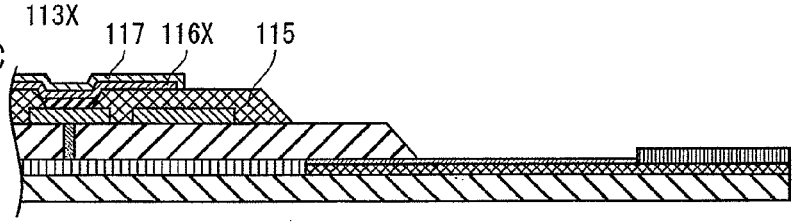

Next, as shown in FIG. 4C, the banks 115, the organic light-emitting layers 116, the electron transport layer 116X and the top electrode 117 are sequentially formed.

The banks 115 are formed by the following steps, for example: first, a bank material layer is formed to cover the entire area where the display part 101 is to be formed; and then portions of the bank material layer are removed by photoresist/photo etching. Note that the banks 115 may be pixel banks that extend in the column and row directions and have a lattice shape in plan view, or line banks that extend in either the column direction or the row direction and have a stripe shape.

Next, the recesses between the banks 115 are filled with ink for organic light-emitting layers by an inkjet method, for example. The ink is dried in reduced-pressure atmosphere at 25° C., and then baked. The organic light-emitting layers 116 are thus formed. Furthermore, the electron transport layer 116X is formed by ETL deposition so as to cover the banks 115 and the organic light-emitting layers 116. The method of filling the recesses between the banks 115 with ink is not limited to the inkjet method. For example, a dispenser method, a nozzle coating method, a spin coating method, intaglio printing or letterpress printing may be used.

Next, the top electrode 117 is formed so as to cover the banks 115 and the organic light-emitting layers 116. The top electrode 117 is formed by, for example, deposition of a light-transmissive material.

This completes the display part formation step of forming the display part 101 on the TFT substrate 111, and the conductive layer formation step of forming the conductive layer 114d made of a conductive metal oxide on the area on the TFT substrate 111 where the terminal 114 is to be formed. In the above-described embodiment, the conductive layer formation step is performed before the display part formation step.

However, the conductive layer formation step may be performed after the display part formation step, or the conductive layer formation step may be performed simultaneously with the process of forming the bottom electrode, which is included in the display part formation step.

Figure 4D:
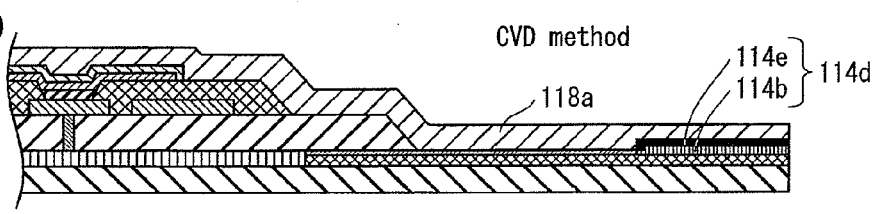

Next, as shown in FIG. 4D, a chemical vapor deposition layer 118a made of an norganic compound (having a thickness of 620 nm, for example) is formed on the entire upper surface of the TFT substrate 111 by a CVD method. In this process, the exposed portions of the conductive layer 114d (i.e. the upper surface and the side surface of the conductive layer 114d) alter. As a result, a damaged layer 114e is formed on the surface of the conductive layer 114d. This completes the chemical vapor deposition layer formation step of forming the chemical vapor deposition layer so that the chemical vapor deposition layer covers the display part 101 and comes into contact at least with the upper surface of the conductive layer 114d and the upper surface of the conductive layer 114d alters. At this point, the conductive layer 114d is composed of the damaged layer 114e and the metal oxide layer 114b underneath the damaged layer 114e.

The CVD method specifically is a plasma CVD method using a reducing gas such as SiN or $SiH_4$ (monosilane). When the chemical vapor deposition layer 118a is formed, the upper surface and the side surface of the conductive layer 114d are subject to reduction and alteration due to the reducing gas. As a result, the damaged layer 114e is formed.

When $SiH_4$ is used as the reducing gas, desirable conditions for the film formation are as follows: the film formation temperature is from 50° C. to 70° C.; the film formation pressure is from 80 Pa to 120 Pa; RF is from 1.1 kW to 1.7 kW; the volume of the flow of $SiH_4$ is from 120 sccm to 180 sccm; the volume of the flow of $NH_3$ is from 70 sccm to 100 sccm; the volume of the flow of $N_2$ is from 2800 sccm to 4200 sccm; and the duration of the film formation is from 130 sec to 190 sec. If the reducing power is too weak, the sealing property of the sealing layer 118 formed later will be insufficient. If the reducing power is too strong, the removability of the sealing layer 118 will be improved, but the display part 101 will be damaged.

Figure 4E:
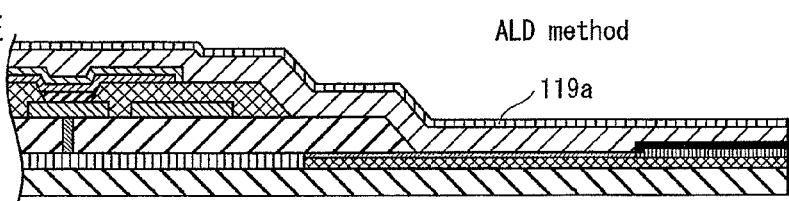

Next, as shown in FIG. 4E, an atomic layer deposition film 119a (with a thickness of 20 nm, for example) is formed all over the upper surface of the TFT substrate 111 by an atomic layer deposition (ALD) method. Specifically, an $Al_2O_3$ film is formed under an atmosphere of Trimethylaluminum (TMA) gas by using oxygen plasma, for example. Desirable conditions for the film formation are as follows: the film formation temperature is from 75° C. to 95° C.; the film formation pressure is from 80 Pa to 120 Pa; RF is from 0.8 kW to 1.2 kW; and the film formation speed is from 0.12 nm/cycle to 0.18 nm/cycle.

Here, the ALD method is a method of depositing gas particles that are as small as atoms. Therefore, even if the selective film formation is performed by using a mask, the gas could enter the gap under the mask. It is thus difficult to form the film exactly on the desired area. In addition, since the atomic layer deposition film 119a is dense, if this film lies on the terminal part 114, the film prevents the conduction between the terminals in the terminal part 114 and the wiring terminals 320. In contrast, by the manufacturing method pertaining to the present embodiment, only the desired portion of the chemical vapor deposition layer 118a can be removed through the removal step, which will be described later. Therefore, there is no need of a mask, and the atomic layer deposition film 119a is unlikely to be formed on the terminal part 114.

Figure 4F:
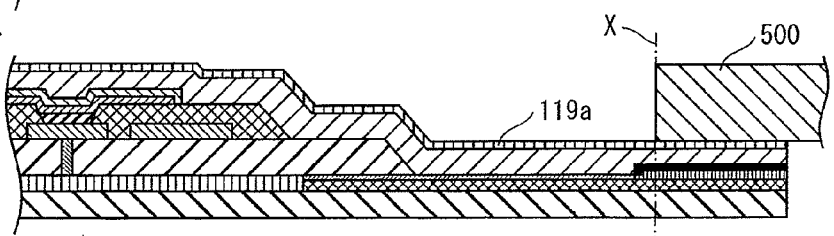
Figure 4G:
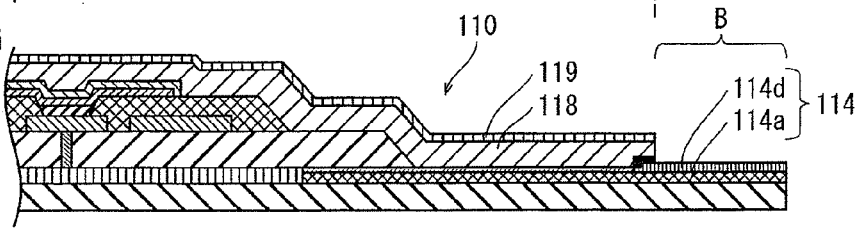

Next, under the condition that the damaged layer 114e remains on the surface of the conductive layer 114d as shown in FIG. 5A, adhesive tape 500 is attached onto a portion of the atomic layer deposition film 119a, the portion being located above the damaged layer 114e (which is also above the conductive layer 114d) as shown in FIG. 4F and FIG. 5B. This completes the adhesive tape attaching step. Examples of the adhesive tape 500 include an ACF.

Next, by removing the adhesive tape 500, the portion of the atomic layer deposition film 119a above the conductive layer 114d, the portion of the chemical vapor deposition layer 118a on the conductive layer 114d, and the damaged layer 114e of the conductive layer 114d are peeled off together. As a result, a portion of the metal oxide layer 114b is exposed. The area to be exposed is the area in which the adhesive tape 500 has been attached as depicted with the solid line B in FIG. 5C (See also the area B shown in FIG. 4G). If the adhesive tape 500 is not attached to the entire portion of the chemical vapor deposition layer 118a on the conductive layer 114d, the portion of the chemical vapor deposition layer 118a on the conductive layer 114d will be partially removed as shown in FIG. 3 and FIG. 5C, and the portion of the metal oxide layer 114b will be partially exposed. If this is the case, a portion of the damaged layer 114e remains on the metal oxide 114b in the area to which the adhesive tape 500 was not attached and which was thus not removed, as shown in FIG. 3.

Note that the adhesive tape 500 may be attached to the entire portion of the chemical vapor deposition layer 118a on the conductive layer 114d and the entire portion of the chemical vapor deposition layer 118a on the conductive layer 114d may be removed.

This completes the removal step of removing the portion of the chemical vapor deposition layer 118a on the conductive layer 114d.

Since the portion of the atomic layer deposition film 119a above the conductive layer 114d and the portion of the chemical vapor deposition layer 118a on the conductive layer 114d are removed, the electrical conductivity between the terminals in the terminal part 114 and the wiring terminals 320 will be excellent. Although it is desirable that the portion of the atomic layer deposition film 119a above the conductive layer 114d and the portion of the chemical vapor deposition layer 118a on the conductive layer 114d are completely removed, residues of the portions may remain on the conductive layer 114d. If this is the case, it is desirable that the amount of the residues is limited so as not to have an influence on the conductivity.

In the removal step, the damaged layer 114e may be completely removed, partially removed, or not removed at all. If the damaged layer 114e is completely removed, no residue of the damaged layer 114e will remain on the terminal part 114. If only a portion of the damaged layer 114e is removed, residues of the damaged layer 114e will remain on the terminal part 114, and if the damaged layer 114e is not removed at all, the entire damaged layer 114e will remain on the terminal part 114. The damaged layer 114e, if remaining on the terminal part 114, has no influence on the conductivity. If part or all of the damaged layer 114e is remaining on the terminal part 114 of a display panel, it can be assumed that the panel is the display panel 100 of the display apparatus 1 manufactured according to the method pertaining to the present invention.

In the removal step, since the damaged layer 114e lies on the surface of the conductive layer 114d, the chemical vapor deposition layer 118a and the atomic layer deposition film 119a are removed together with the adhesive tape 500 from the TFT substrate 111. These layers are removed at the interface between the damaged layer 114e and the chemical vapor deposition layer 118a, the interface between the damaged layer 114e and the metal oxide layer 114b, or at an area within the thickness of the damaged layer 114e, because these areas are weak.

The reason for the weakness can be assumed as follows. For example, when the surface of the conductive layer 114d is exposed to the reducing gas used in the chemical vapor deposition method, the metal oxide include in the surface of the conductive layer 114d is partially reduced to metal. The partial loss of the metal oxide and the extraction of the metal forms concavities and convexities on the surface of the conductive layer 114d, which leads to the degradation of the adhesiveness between the conductive layer 114d and the chemical vapor deposition layer 118a. The alteration of the surface of the conductive layer 114d can be observed from the blackening or whitening of the metal oxide layer 114b after the chemical vapor deposition. The metal oxide layer 114b is made of ITO and is originally transparent.

Figure 6:
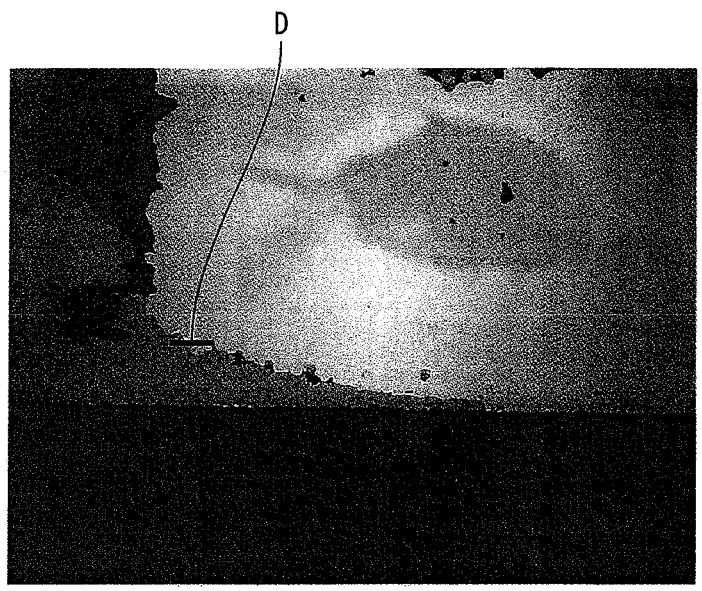
FIG. 6 is an electron micrograph showing the state of the surface of a test substrate.
Figure 7:
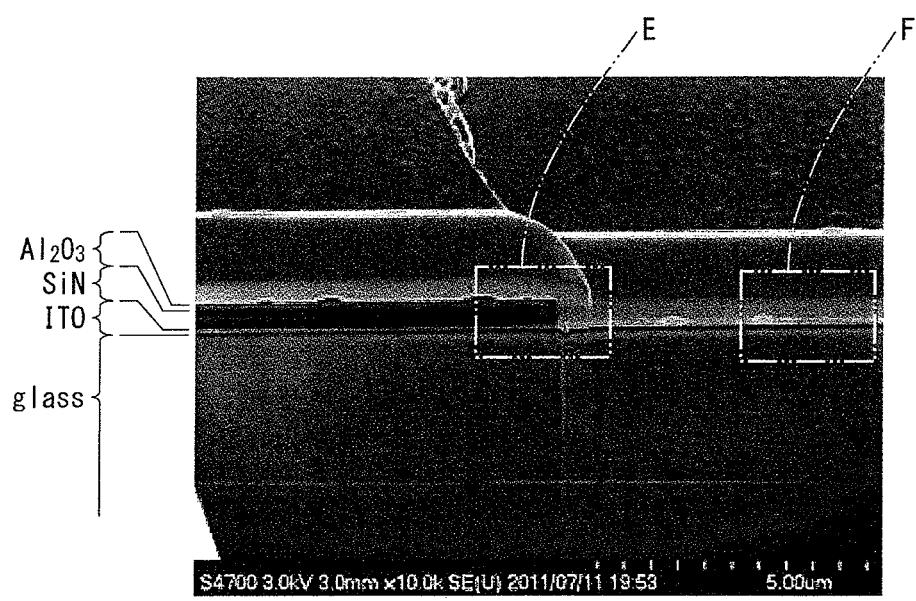
FIG. 7 is an electron micrograph showing the cross-section along the line D shown in FIG. 6.
Figure 8A:
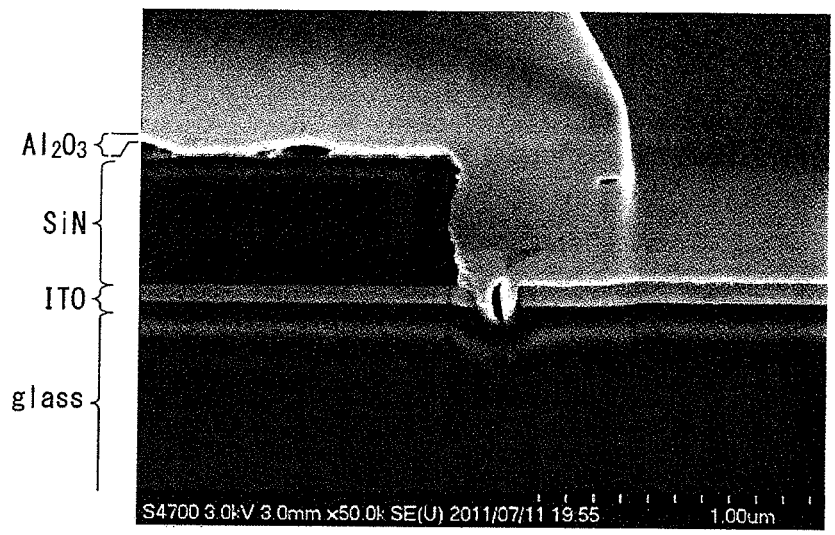
FIGS. 8A and 8B are enlarged electron micrographs respectively showing areas E and F surrounded by two-dot chain lines shown in FIG. 7.
Figure 8B:
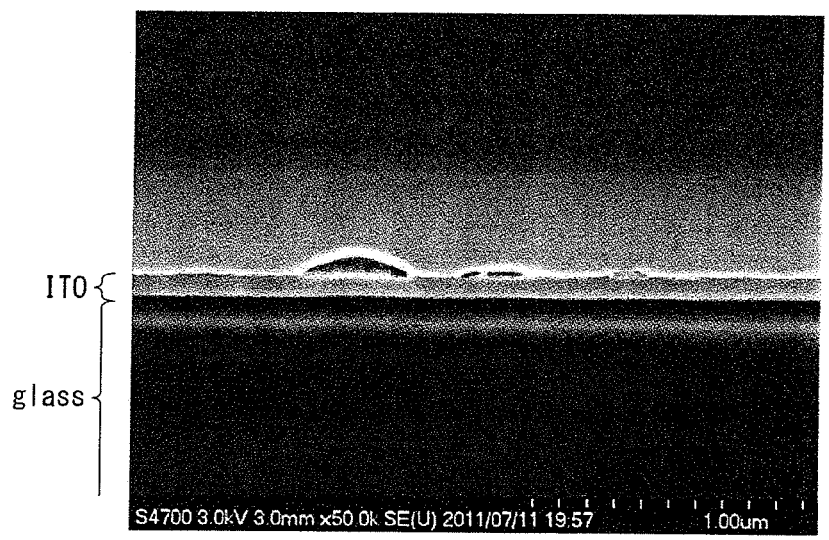

FIG. 6 is an electron micrograph of the surface of the test substrate. This substrate was prepared by forming a conductive layer made of ITO on a glass substrate, and underwent the following processes: first, the chemical vapor deposition layer is formed by a plasma CVD method; next, the atomic layer deposition film is formed by an ALD method; and finally, the layers are removed with an ACF. FIG. 7 is an electron micrograph showing the cross-section along the line D shown in FIG. 6. FIGS. 8A and 8B are enlarged electron micrographs respectively showing the areas E and F surrounded by the two-dot chain lines shown in FIG. 7.

As seen from FIGS. 6 through 8, the portion of the chemical vapor deposition layer and the portion of the atomic layer deposition film on the conductive layer are almost completely removed by the removal step. In FIGS. 7 and 8, the layer composed of $Al_2O_3$ is the atomic layer deposition film 119a, the layer composed of SiN is the chemical vapor deposition layer 118a, and the layer composed of ITO is the metal oxide layer 114b.

The device substrate 110 is manufactured as described above.

In the manufacturing processes shown in FIGS. 4A through 4G, the step of disposing the CF substrate is omitted. In the case of disposing the CF substrate, it is desirable that the step of disposing the CF substrate is performed after the step of forming the atomic layer deposition film shown in FIG. 4E and before the step of attaching the adhesive tape shown in FIG. 4F.

[Tests]

The influence of the chemical vapor deposition layer and the atomic layer deposition film on the conductivity was tested. FIG. 9 shows the results of the tests about the influence of the chemical vapor deposition layer and the atomic layer deposition film on the conductivity. In the tests, a laminate was prepared by forming an ITO layer, an SiN layer, and an $Al_2O_3$ film on a 100 mm square glass plate, the wiring board was connected to the laminate via an ACF, and the resistance of the laminate was measured with a resistance tester.

The ACF used in the tests contains 4 μm Ni-coated plastic particles as conductive particles. The wiring board was connected to the laminate via the ACF by using a device for thermal compression bonding with the following settings: the temperature was 250° C.; the duration was 15 sec; and the pressure was 120 Pa.

As shown in FIG. 9, the resistance of the laminate with an $Al_2O_3$ film having a thickness of 2 nm (Test 2) was approximately 1.5 times the resistance of the laminate with no $Al_2O_3$ film (Test 1). Furthermore the resistance of the laminate with an $Al_2O_3$ film having a thickness of 5 nm (Test 3) was approximately 2 times, and the laminate with an $Al_2O_3$ film having a thickness of 8 nm or greater (Tests 4 to 6) was not conductive. These results show that an $Al_2O_3$ film having a thickness of 2 nm or greater prevents the conduction.

In contrast, the resistance of the laminate on which an $Al_2O_3$ film having a thickness of 20 nm and an SiN layer of 620 nm were formed and which underwent the removal step (Test 7) was approximately the same as the resistance of Test 1. The SiN layer and the $Al_2O_3$ film were removed in the removal step. Note that the laminate before the removal step was not conductive.

Next, further tests were conducted for investigation of the influence of the state of the adhesive tape on the removability. FIG. 10 shows the results of the tests about the influence of the state of the adhesive tape on the removability. In the tests, a laminate was prepared by forming an ITO layer, an SiN layer, and an $Al_2O_3$ film on a 100 mm square glass plate, and the SiN layer and the $Al_2O_3$ layer were removed from the laminate by using adhesive tape. The removability of these layers was tested. An ACF was used as the adhesive tape. The adhesive tape was attached to the laminate under the conditions shown in FIG. 10 by using the device for thermal compression bonding described above.

As shown in FIG. 10, when the ACF was hardened more than the case under the basic conditions (Test 8) by increasing the temperature for thermal compression bonding (Test 9), the ACF was slightly hard to remove, and residues of the ACF remained on the glass plate. However, there was almost no influence on the removability or the conductivity. The pressure was also increased (Test 10) or decreased (Test 11) to change the hardness of the ACF. However, there was no influence on the removability or the conductivity.

The hardness of the ACF is determined by the product of the temperature for thermal compression bonding and the duration of the thermal compression bonding. Under the conditions considering the hardness (i.e. the strength of the adhesion) of the ACF resin, the removability was excellent except for the case under a high temperature condition. Under a high temperature condition, there is a risk that the layers will be removed at the interface between the ACF and the atomic layer deposition film 119a or at the interface between the TFT substrate 111 and the metal layer 114a.

Finally, the case of using an ACF not containing conductive particles (Test 12) was compared with the case of using an ACF containing conductive particles (Test 8). There was no difference in the removability and the conductivity between them. This result shows that the excellent conductivity is due to the fact that the SiN layer and the $Al_2O_3$ film were removed at the interface with the damaged layer, and is not due to the conductive particles causing cracks in the SiN layer and the $Al_2O_3$ film and making them likely to be removed.

[Modifications]

While a display panel manufacturing method, display apparatus manufacturing method, display panel and display apparatus according to aspects of the present invention have been concretely described, the above embodiment is merely an example for clearly illustrating the operations and advantageous effects of aspects of the present invention. The present invention is in no way limited to the above embodiment. For example, the following modifications can also be implemented.

FIGS. 11A through 11G are an illustration of a method of manufacturing a display panel pertaining to Modification 2. According to the method of manufacturing a display panel pertaining to Modification 1, the protective film is not formed. This is the difference from the method of manufacturing a display panel pertaining to the embodiment described above, according to which the protective film is formed. The other features are basically the same as the method of manufacturing a display panel pertaining to the embodiment described above. The following only describes the difference in detail, and the explanations of the other features are omitted. In the following, same components as the components of the display panel pertaining to the above embodiment are given the same reference signs.

Figure 11A:
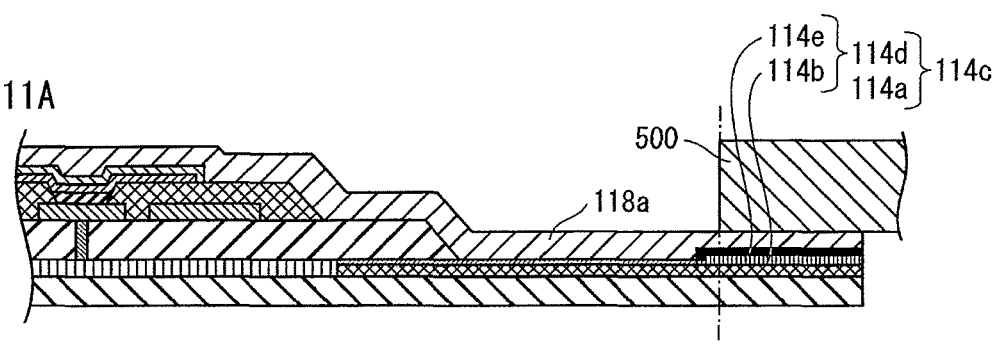
FIGS. 11A and 11B are an illustration of a method of manufacturing a display panel pertaining to Modification 1.
Figure 11B:
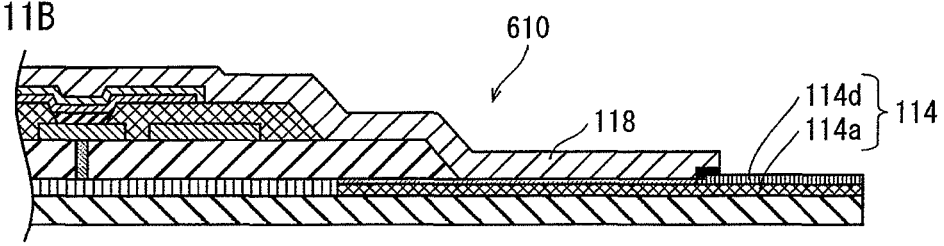

According to the method of manufacturing a display panel according to Modification 1, after the chemical vapor deposition layer 118a is formed by the CVD method as shown in FIG. 4D, the atomic layer deposition film 119a is not formed. The adhesive tape 500 is attached onto a portion of the chemical vapor deposition layer 118a, the portion being located on the conductive layer 114d, as shown in FIG. 11A. This completes the adhesive tape attaching step.

Next, by removing the adhesive tape 500, the portion of the chemical vapor deposition layer 118a on the conductive layer 114d and the damaged layer 114e of the conductive layer 114d are removed together. As a result, a portion of the metal oxide layer 114b is exposed. This completes the removal step of removing the portion of the chemical vapor deposition layer 118a on the conductive layer 114d.

The device substrate 610 is manufactured as described above.

Note that in the case of disposing the CF substrate, it is desirable that the step of disposing the CF substrate is performed after the step of forming the chemical vapor deposition layer as shown in FIG. 4D and before the step of attaching the adhesive tape as shown in FIG. 11A.

As explained above, the atomic layer deposition film formation step is not essential for the method of manufacturing a display panel pertaining to the present disclosure.

FIGS. 12A through 12G are an illustration of a method of manufacturing a display panel pertaining to Modification 2. According to the method of manufacturing a display panel pertaining to Modifications 2, the terminal part is formed from only a metal layer. This is the difference from the method of manufacturing a display panel pertaining to the above embodiment, according to which the terminal part is made up of a metal layer and a metal oxide layer. The other features are basically the same as the method of manufacturing a display panel pertaining to the embodiment described above. The following only describes the difference in detail, and the explanations of the other features are omitted. In the following, same components as the components of the display panel pertaining to the above embodiment are given the same reference signs.

Figure 12A:
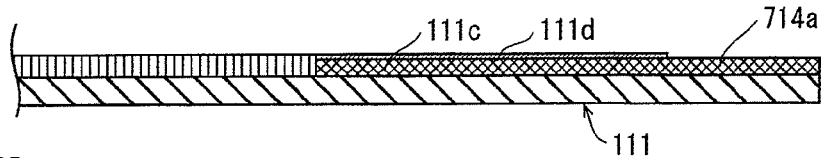
FIGS. 12A through 12G are an illustration of a method of manufacturing a display panel pertaining to Modification 2.

According to the method of manufacturing a display panel pertaining to Modification 2, first, as shown in FIG. 12A, the terminal preparation area, where the terminal 714 is to be formed, is removed from the passivation film 111d on the TFT substrate 111 so that the metal layer 714a, which is a portion of the SD wiring 111c, is exposed. The metal layer 714a, which is a portion of the SD wiring 111c on the TFT substrate 111 after removing the terminal preparation area, is also referred to as the conductive layer 714a.

Figure 12B:
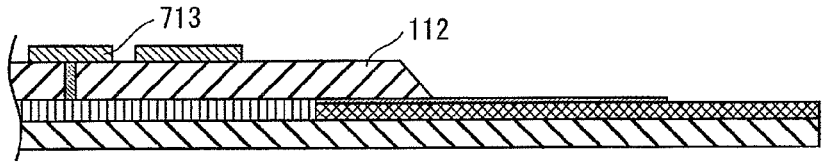

Next, as shown in FIG. 12B, the planarizing film 112 (having a thickness of 4 µm, for example) is formed by, for example, spin-coating a resin and patterning the resin by photoresist/photo etching. Furthermore, the bottom electrode 713, for example, is formed from the metal layer. The bottom electrodes 713 are formed by the following steps, for example: first, a metal thin film is formed by vacuum vapor deposition or sputtering; and then the metal thin film is patterned by photoresist/photo etching.

Figure 12C:
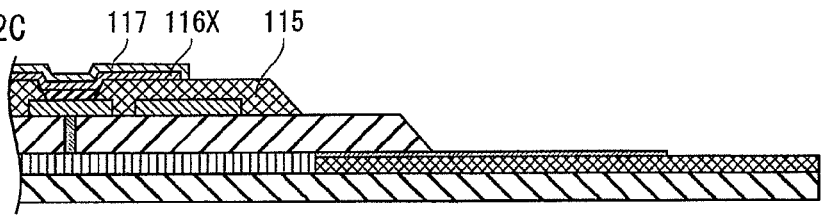

Next, as shown in FIG. 12C, the bank 115, the organic light-emitting layer 116, the electron transport layer 116X and the top electrode 117 are sequentially formed.

This completes the display part formation for forming the display part 101 on the TFT substrate 111, and the conductive layer formation for forming the conductive layer 714d made of metal on the area on the TFT substrate 111 where the terminal 714 is to be formed.

Figure 12D:
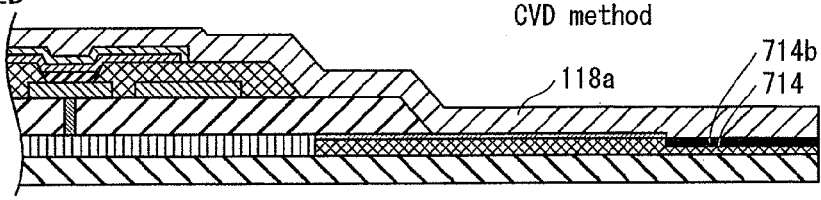

Next, as shown in FIG. 12D, the chemical vapor deposition layer 118a made of an inorganic compound is formed on the entire upper surface of the TFT substrate 111 by a plasma CVD method. In this process, the exposed portions of the conductive layer 714a (i.e. the upper surface and the side surface of the conductive layer 714a) alter. As a result, a damaged layer 114b is formed on the surface of the conductive layer 714a. This completes the chemical vapor deposition layer formation step of forming the chemical vapor deposition layer such that the chemical vapor deposition layer covers the display part and comes into contact at least with the upper surface of the conductive layer 714a and the upper surface of the conductive layer 714a alters. At this point, the conductive layer 714a is composed of the damaged layer 714b and the terminal 714 made of metal underneath the damaged layer 714b.

Figure 12E:
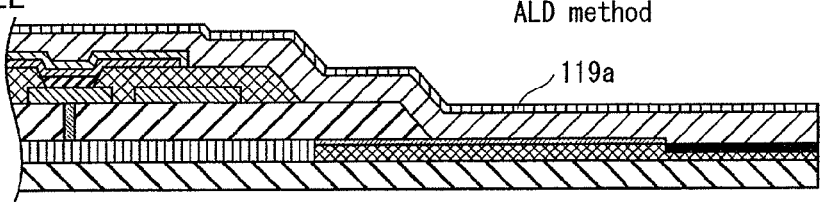

Next, as shown in FIG. 12E, an atomic layer deposition film 119a is formed all over the upper surface of the TFT substrate 111 by an ALD method.

Figure 12F:
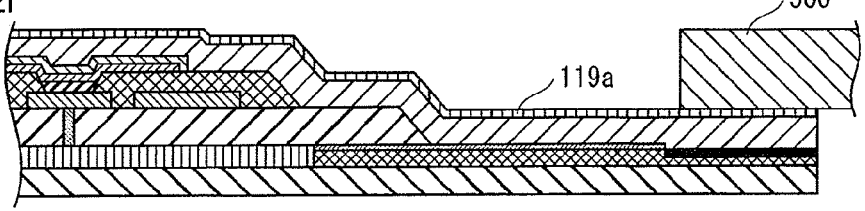

Next, as shown in FIG. 12F, the adhesive tape 500 is attached onto a portion of the atomic layer deposition film 119a, the portion being located above the damaged layer 714b (which is also above the conductive layer 714d). This completes the adhesive tape attaching step.

Figure 12G:
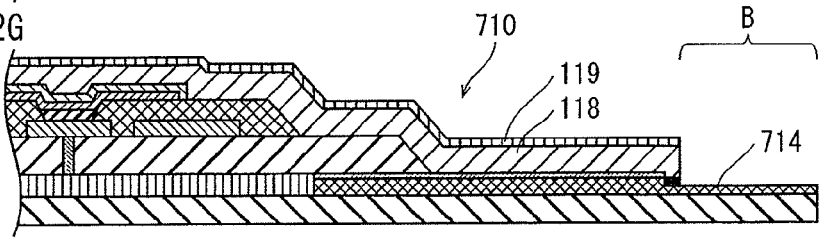
Figure 13A:
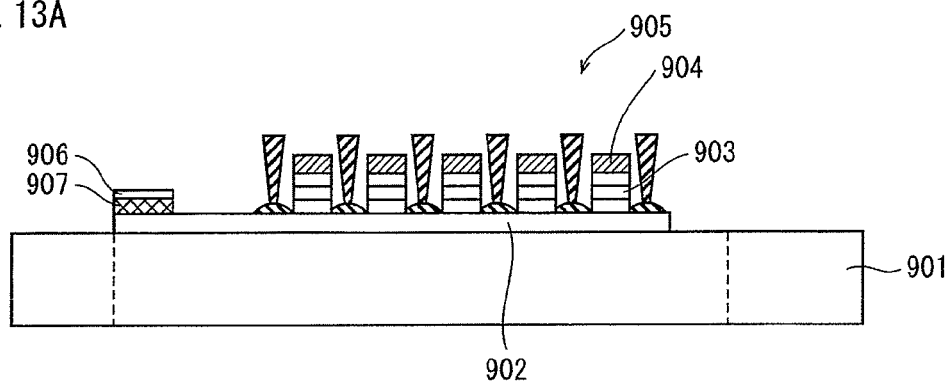
FIGS. 13A through 13C are an illustration of a conventional method of manufacturing a display panel.
Figure 13B:
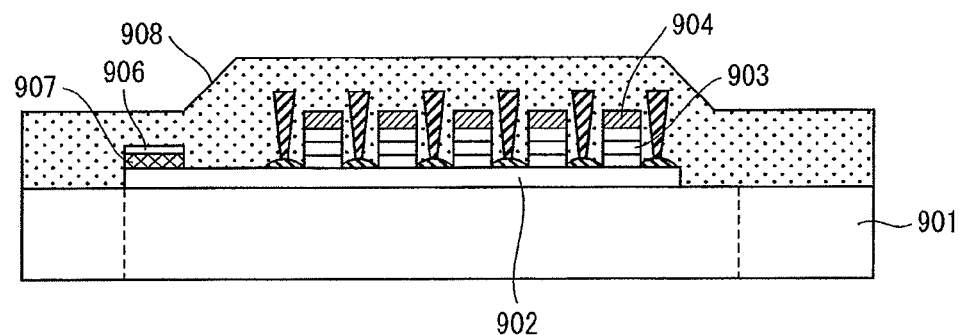
Figure 13C:
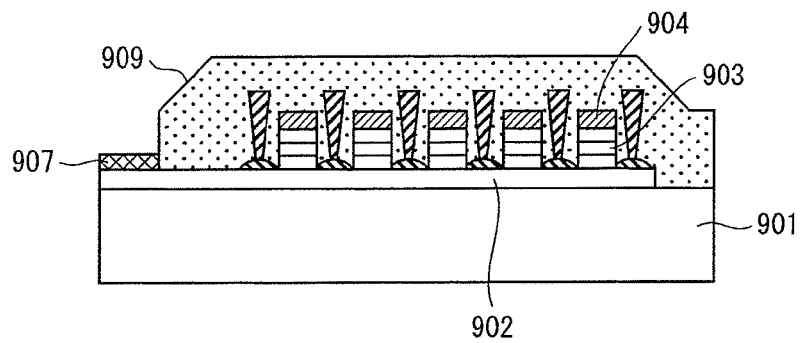

Next, by removing the adhesive tape 500, the portion of the atomic layer deposition film 119a above the conductive layer 714a, the portion of the chemical vapor deposition layer 118a on the conductive layer 714a, and the damaged layer 714b of the conductive layer 714a are removed together as shown in FIG. 12G. As a result, the terminal 714 are exposed. This completes the removal step of removing the portion of the chemical vapor deposition layer 118a on the conductive layer 714a.

In the removal step, since the damaged layer 714b lies on the surface of the conductive layer 714a, the chemical vapor deposition layer 118a and the atomic layer deposition film 119a are removed together with the adhesive tape 500 from the TFT substrate 111. These layers are removed at the interface between the damaged layer 714b and the chemical vapor deposition layer 118a, the interface between the damaged layer 714b and the terminal 714, or at an area within the thickness of the damaged layer 714b, because these areas are weak. The reason for the weakness of these areas is, for example, that the surface of the conductive layer 714a is damaged by plasma used in the plasma CVD method.

The device substrate 710 is manufactured as described above.

In the manufacturing processes shown in FIGS. 12A through 12G, the step of disposing the CF substrate is omitted. In the case of disposing the CF substrate, it is desirable that the step of disposing the CF substrate is performed after the step of forming the atomic layer deposition film shown in FIG. 12E and before the step of attaching the adhesive tape shown in FIG. 12F.

As described above, according to the method of manufacturing a display panel pertaining to the present disclosure, the conductive layer may be made from metal in the conductive layer formation step.

As another modification example, one or more layers may be formed on the atomic layer deposition film. Also in this case, the portions on the conductive layer can be removed by performing the removal step. The method of removing the chemical vapor deposition layer is not limited to the method using the adhesive tape. For example, the layer may be removed by a method using laser.

INDUSTRIAL APPLICABILITY

A display panel and display apparatus according to an aspect of the present disclosure may be favorably used in the home, in public facilities, and in the workplace in various display apparatuses, televisions, displays for portable electronic devices, and the like.

REFERENCE SIGNS LIST

1: display device
100: display panel
101: display part
111: TFT substrate
114, 714: terminal part
114c, 714a: conductive layer
118a: chemical vapor deposition layer
119a: atomic layer deposition film
500: adhesive tape

The invention claimed is:

1. A method of manufacturing a display panel having a display and a terminal each formed on a different area on a substrate, comprising:
   forming the display on the substrate;
   forming a conductive layer of a conductive metal oxide or a metal on an area on the substrate where the terminal is to be formed;
   forming a chemical vapor deposition layer of an inorganic compound by a chemical vapor deposition method so that the chemical vapor deposition layer covers the display and comes into contact at least with an upper surface of the conductive layer and to alter the upper surface of the conductive layer; and
   removing a portion of the chemical vapor deposition layer by peeling the portion off, the portion being located on the conductive layer, wherein
   the conductive layer comprises a conductive metal oxide, and
   the forming of the chemical vapor deposition layer includes weakening adhesion strength between the conductive layer and the chemical vapor deposition layer by causing alteration of the conductive metal oxide contained in the upper surface of the conductive layer by reduction thereof using a reducing gas.

2. The method of claim 1, further comprising:
   attaching adhesive tape onto the portion of the chemical vapor deposition layer after performing the formation of the chemical vapor deposition layer and before performing the removing,
   wherein in the removing, the portion of the chemical vapor deposition layer is peeled off by pulling the adhesive tape off.

3. The method of claim 1, further comprising:
   forming an atomic layer deposition film on the chemical vapor deposition layer by an atomic layer deposition method after performing the forming of the chemical vapor deposition layer and before performing the removing.

4. The method of claim 3, further comprising:
   attaching adhesive tape onto a portion of the atomic layer deposition film after performing the forming of the atomic layer deposition film and before performing the removing, the portion being located above the conductive layer, wherein
   in the removing, the portion of the chemical vapor deposition layer and the portion of the atomic layer deposition film are peeled off by pulling the adhesive tape off.

5. The method of claim 1,
   wherein the conductive metal oxide is ITO or IZO.

6. The method of claim 1,
   wherein the reducing gas is SiN or $SiH_4$.

7. The method of claim 1,
   wherein in forming of the chemical vapor deposition layer, a damaged layer is formed on the upper surface of the conductive layer simultaneously with the chemical vapor deposition layer.

8. A method of manufacturing a display panel having a display and a terminal each formed on a different area on a substrate, comprising:
   forming the display on the substrate;
   forming a conductive layer of a conductive metal oxide or a metal on an area on the substrate where the terminal is to be formed;
   forming a chemical vapor deposition layer of an inorganic compound by a chemical vapor deposition method so that the chemical vapor deposition layer covers the display and comes into contact at least with an upper surface of the conductive layer and to alter the upper surface of the conductive layer; and
   removing a portion of the chemical vapor deposition layer by peeling the portion off, the portion being located on the conductive layer, wherein
   the conductive layer comprises a conductive metal oxide, and
   the forming of the chemical vapor deposition layer includes forming a damaged layer by causing alteration of the conductive metal oxide contained in the upper surface of the conductive layer by reduction thereof using a reducing gas, the chemical vapor deposition layer and the damaged layer being formed simultaneously.

9. The method of claim 8,
   wherein the forming of the damaged layer weakens adhesion strength between the conductive layer and the chemical vapor deposition layer.

* * * * *